United States Patent [19]

Yabuki et al.

[11] Patent Number: 5,055,804
[45] Date of Patent: Oct. 8, 1991

[54] OSCILLATOR

[75] Inventors: Hiroyuki Yabuki, Kawasaki; Morikazu Sagawa, Tokyo, both of

[73] Assignee: Matsushita Electric Industrial Co., Ltd., Osaka, Japan

[21] Appl. No.: 534,866

[22] Filed: Jun. 8, 1990

[30] Foreign Application Priority Data

Jun. 21, 1989 [JP] Japan .................................. 1-158673
Feb. 5, 1990 [JP] Japan .................................. 2-25403

[51] Int. Cl.$^5$ ............................................. H03B 5/12
[52] U.S. Cl. ................................. 331/117 R; 331/60; 331/74
[58] Field of Search .................... 331/18, 45, 60, 61, 331/74, 75, 117 R, 117 FE, 167, 168

[56] References Cited

U.S. PATENT DOCUMENTS

| | | | |
|---|---|---|---|
| 3,922,615 | 11/1975 | Sobajima | 330/30 D |
| 3,963,996 | 6/1976 | Skerlos | 331/117 R |
| 4,063,193 | 12/1977 | Wilcox | 231/117 R |
| 4,243,953 | 1/1981 | Balaban et al. | 331/117 R |
| 4,270,102 | 5/1981 | Gawler et al. | 331/117 R X |
| 4,346,351 | 8/1982 | Wilcox | 331/117 R |
| 4,353,039 | 10/1982 | Huntley | 331/117 R X |
| 4,492,934 | 1/1985 | Sugimoto | 331/117 R |
| 4,633,195 | 12/1986 | Main | 331/117 R |

FOREIGN PATENT DOCUMENTS

| | | | |
|---|---|---|---|
| 0083664 | 7/1983 | European Pat. Off. | |
| 0074263 | 6/1977 | Japan | 331/117 R |
| 64-8704 | 1/1989 | Japan | |

Primary Examiner—David Mis
Attorney, Agent, or Firm—Pollock, VandeSande & Priddy

[57] ABSTRACT

An oscillator includes first and second transistors and a parallel resonant circuit. The resonant circuit has first and second ends. The first end of the resonant circuit is connected to a base of the first transistor and a collector of the second transistor. The second end of the resonant circuit is connected to a base of the second transistor and a collector of the first transistor. A voltage dropping device is connected between the first end of the resonant circuit and a power supply for providing a voltage drop to expose the first and second transistors to driving voltages lower than a voltage of the power supply.

3 Claims, 3 Drawing Sheets

OSCILLATOR

BACKGROUND OF THE INVENTION

1. Field of the Invention

This invention relates to an oscillator usable in various apparatuses such as mobile radio communication equipments.

2. Description of the Prior Art

A good way of miniaturizing an oscillator is to form at least part of the oscillator by an integrated circuit (IC).

Japanese published unexamined patent application 64-8704 discloses an oscillator designed to be formed by an IC. In the oscillator of Japanese patent application 64-8704, a power supply voltage is directly applied to the collectors of transistors, so that the amplitude of an oscillator output vibrates around the power supply voltage and an RF oscillator signal tends to leak toward the power supply. In addition, since the power supply voltage is directly applied to the bases of the transistors, the base bias voltages can not be freely set to optimal values which are determined from the standpoint of a C/N ratio (a carrier-to-noise ratio). Furthermore, the base voltages and the collector voltages fluctuate with variations in the power supply voltage, so that the C/N ratio tends to be lowered by the variations in the power supply voltage.

SUMMARY OF THE INVENTION

It is an object of this invention to provide an excellent oscillator.

It is another object of this invention to provide an arrangement including an oscillator.

According to a first aspect of this invention, an oscillator comprises first and second transistors; a parallel resonant circuit having first and second ends, wherein the first end of the resonant circuit is connected to a base of the first transistor and a collector of the second transistor, and the second end of the resonant circuit is connected to a base of the second transistor and a collector of the first transistor; a power supply; and voltage dropping means connected between the first end of the resonant circuit and the power supply for providing a voltage drop to expose the first and second transistors to driving voltages lower than a voltage of the power supply.

According to a second aspect of this invention, an arrangement comprises an oscillator; and a buffer connected to the oscillator and including a differential amplifier; wherein the oscillator comprises first and second transistors; a parallel resonant circuit having first and second ends, wherein the first end of the resonant circuit is connected to a base of the first transistor and a collector of the second transistor, and the second end of the resonant circuit is connected to a base of the second transistor and a collector of the first transistor; a power supply; and voltage dropping means connected between the first end of the resonant circuit and the power supply for providing a voltage drop to expose the first and second transistors to driving voltages lower than a voltage of the power supply.

According to a third aspect of this invention, an arrangement for supplying an oscillation signal to an external circuit and a prescaler comprises an oscillator; a first buffer connected between the oscillator and the external circuit and including at least one differential amplifier of a single-phase drive type; and a second buffer connected between the oscillator and the prescaler and including at least one differential amplifier of a single-phase drive type; wherein the differential amplifier of each of the first and second buffers comprises first and second transistors, a resistor, and a bypass capacitor, wherein a base of the first transistor is directly connected to the oscillator and a base of the second transistor is connected to the oscillator via the resistor, and the base of the second transistor is grounded via the capacitor, and wherein a collector of the second transistor is connected to one of the external circuit and the prescaler.

According to a fourth aspect of this invention, an arrangement for supplying an oscillation signal to an external circuit and a prescaler comprises an oscillator; a first buffer connected between the oscillator and the external circuit and including at least one differential amplifier of a single-phase drive type; and a second buffer connected between the oscillator and the prescaler and including at least one differential amplifier of a single-phase drive type; wherein the differential amplifier of each of the first and second buffers comprises first and second transistors, a resistor, and a bypass capacitor, wherein a base of the first transistor is directly connected to the oscillator and a base of the second transistor is connected to the oscillator via the resistor, and the base of the second transistor is grounded via the capacitor, and wherein a collector of the second transistor is connected to one of the external circuit and the prescaler; wherein the oscillator comprises third and fourth transistors, a parallel resonant circuit having first and second ends, wherein the first end of the resonant circuit is connected to a base of the third transistor and a collector of the fourth transistor, and the second end of the resonant circuit is connected to a base of the fourth transistor and a collector of the third transistor; a power supply; and voltage dropping means connected between the first end of the resonant circuit and the power supply for providing a voltage drop to expose the third and fourth transistors to driving voltages lower than a voltage of the power supply.

BRIEF DESCRIPTION OF THE DRAWINGS

Like and corresponding elements are denoted by the same reference characters throughout FIG. 1 to FIG. 5.

DESCRIPTION OF THE FIRST PREFERRED EMBODIMENT

Figure 1:
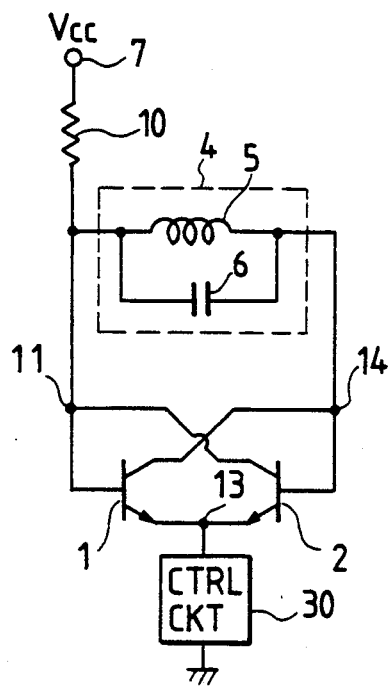
FIG. 1 is a schematic diagram of an oscillator according to a first embodiment of this invention.

With reference to FIG. 1, an oscillator of a first embodiment of this invention includes a pair of NPN transistors 1 and 2. The emitters of the transistors 1 and 2 are connected in common at a junction 13, and the junction 13 is grounded via a current control circuit 30. The base of the transistor 1 is connected to the collector of the transistor 2. Similarly, the base of the transistor 2 is connected to the collector of the transistor 1.

A parallel resonant circuit 4 includes a parallel combination of an inductor 5 and a capacitor 6. One end of the resonant circuit 4 is connected to the collector of the transistor 1. The other end of the resonant circuit 4 is connected to the collector of the transistor 2.

The junction 11 between the collector of the transistor 2 and the resonant circuit 4 is connected to a positive terminal 7 of a power supply via a resistor 10. The positive terminal 7 of the power supply has a positive potential Vcc relative to the ground. It should be noted that a negative terminal of the power supply is grounded.

The transistors 1 and 2 cooperate to generate an oscillation signal whose frequency is determined by the resonant circuit 4. In general, the junction 11 between the collector of the transistor 2 and the resonant circuit 4, and the junction 14 between the collector of the transistor 1 and the resonant circuit 4 are used as output terminals for transmitting the oscillation signal to an external circuit.

A voltage drop occurs across the resistor 10 in dependence on currents flowing from the power supply through the transistors 1 and 2. The resistor 10 enables the collector voltages of the transistors 1 and 2 to be lower than the power supply voltage Vcc. Therefore, the center of the amplitude of the oscillation output signal is lower than the power supply voltage Vcc, and the oscillation signal is prevented from leaking toward the power supply. In general, the resistance of the resistor 10 is chosen so as to ensure optimal operation of the transistors 1 and 2.

DESCRIPTION OF THE SECOND PREFERRED EMBODIMENT

Figure 2:
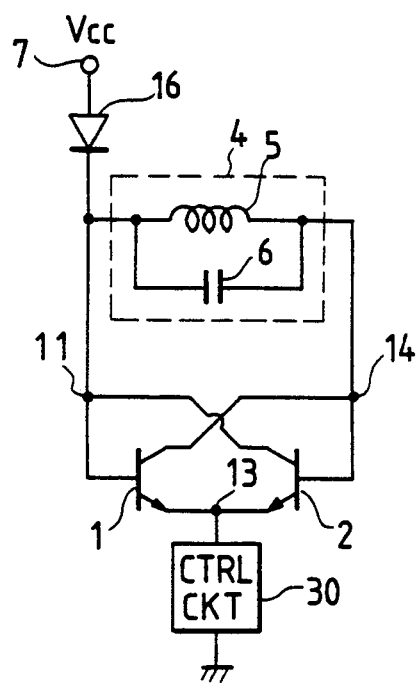
FIG. 2 is a schematic diagram of an oscillator according to a second embodiment of this invention.

FIG. 2 shows a second embodiment of this invention which is similar to the embodiment of FIG. 1 except that a diode 16 is used in place of the resistor 10. The anode of the diode 16 is connected to the positive power supply terminal 7. The cathode of the diode 16 is connected to the junction 11 between the collector of the transistor 2 and the resonant circuit 4.

A voltage drop occurs across the diode 16 in correspondence with the threshold voltage of the diode 16. The diode 16 enables the collector voltages of the transistors 1 and 2 to be lower than the power supply voltage Vcc. Therefore, the center of the amplitude of the oscillation output signal is lower than the power supply voltage Vcc, and the oscillation signal is prevented from leaking toward the power supply.

DESCRIPTION OF THE THIRD PREFERRED EMBODIMENT

Figure 3:
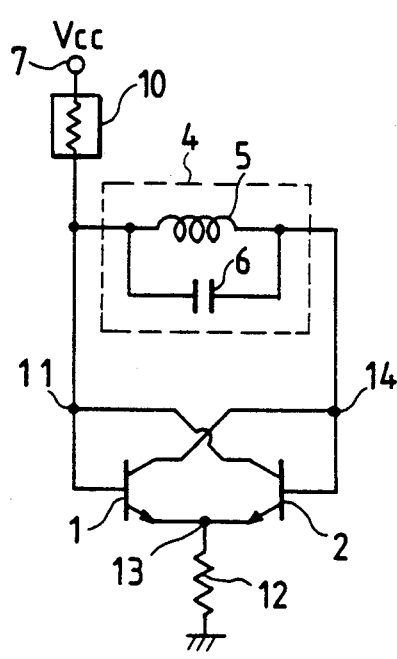
FIG. 3 is a schematic diagram of an oscillator according to a third embodiment of this invention.

FIG. 3 shows a third embodiment of this invention which is similar to the embodiment of FIG. 1 except that a resistor 12 is used in place of the current control circuit 30. The resistor 12 has a function similar to the function of the current control circuit 30. The basic operation and advantage of the embodiment of FIG. 3 are similar to those of the embodiment of FIG. 1. It should be noted that the resistor 10 may be replaced by a diode as in the embodiment of FIG. 2.

DESCRIPTION OF THE FOURTH PREFERRED EMBODIMENT

Figure 4:
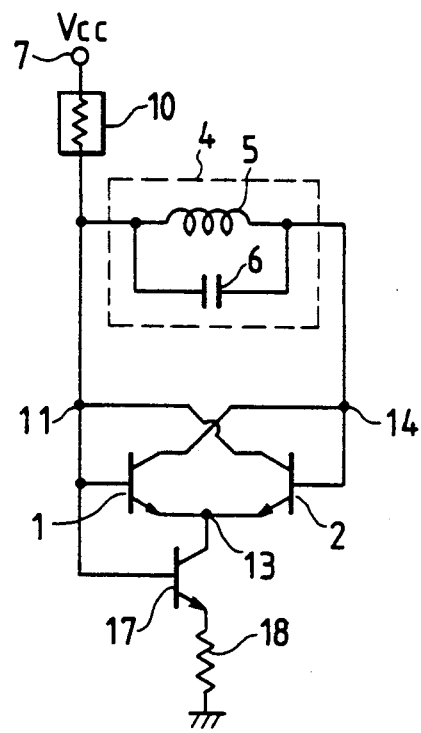
FIG. 4 is a schematic diagram of an oscillator according to a fourth embodiment of this invention.

FIG. 4 shows a fourth embodiment of this invention which is similar to the embodiment of FIG. 1 except that a combination of an NPN transistor 17 and a resistor 18 is used in place of the current control circuit 30. The base of the transistor 17 is connected to the junction 11 between the collector of the transistor 2 and the resonant circuit 4. The collector of the transistor 17 is connected to the junction 13 between the emitters of the transistors 1 and 2. The emitter of the transistor 17 is grounded via the resistor 18. The combination of the transistor 17 and the resistor 18 has a function similar to the function of the current control circuit 30. The basic operation and advantage of the embodiment of FIG. 4 are similar to those of the embodiment of FIG. 1. It should be noted that the resistor 10 may be replaced by a diode as in the embodiment of FIG. 2.

DESCRIPTION OF THE FIFTH PREFERRED EMBODIMENT

Figure 5:
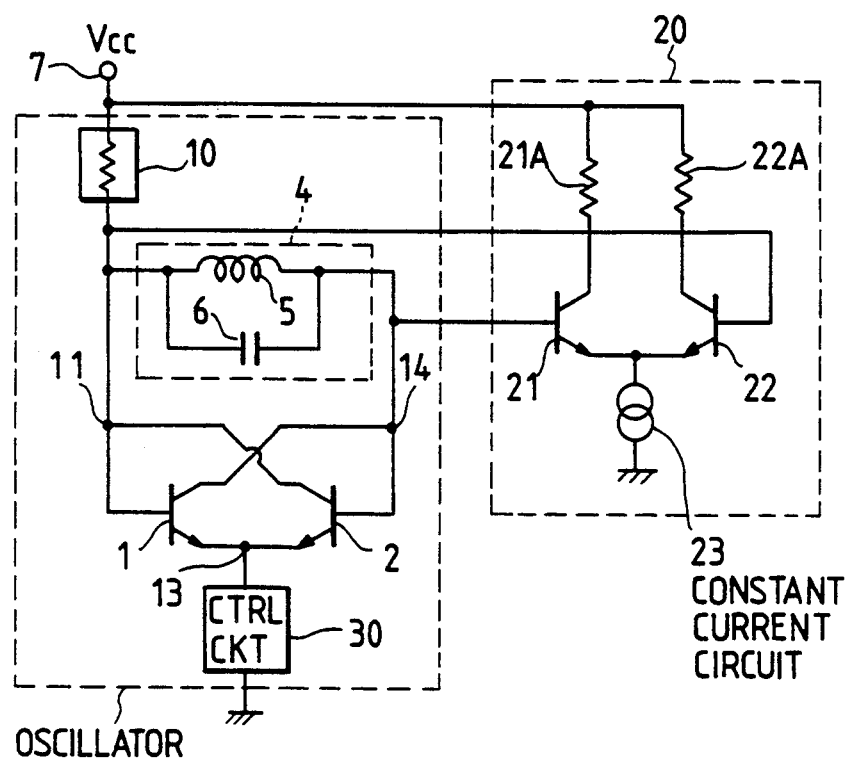
FIG. 5 is a schematic diagram of an arrangement including an oscillator and a buffer amplifier according to a fifth embodiment of this invention.

FIG. 5 shows a fifth embodiment of this invention which is similar to the embodiment of FIG. 1 except that a differential amplifier 20 is added. The differential amplifier 20 serves as a buffer for the oscillator. The differential amplifier 20 includes a pair of NPN transistors 21 and 22. The collectors of the transistors 21 and 22 are connected to the positive power supply terminal 7 via resistors 21A and 22A respectively. The base of the transistor 21 is connected to the junction 14 between the collector of the transistor 1 and the resonator 4 within the oscillator. The base of the transistor 22 is connected to the junction 11 between the collector of the transistor 2 and the resonator 4 within the oscillator. In this way, the buffer amplifier 20 is directly coupled to the oscillator without using any coupling capacitor. The emitters of the transistors 21 and 22 are connected in common, and are grounded via a constant current circuit 23. The buffer amplifier 20 dispenses with any bypass capacitor or grounding capacitor. It should be noted that the resistor 10 may be replaced by a diode as in the embodiment of FIG. 2.

A pair of RF signals are generated at the collectors of the transistors 21 and 22 respectively in accordance with the oscillation signal. These RF signals have opposite phases. In general, at least one of the RF signals is outputted to an external circuit.

DESCRIPTION OF THE SIXTH PREFERRED EMBODIMENT

Figure 6:
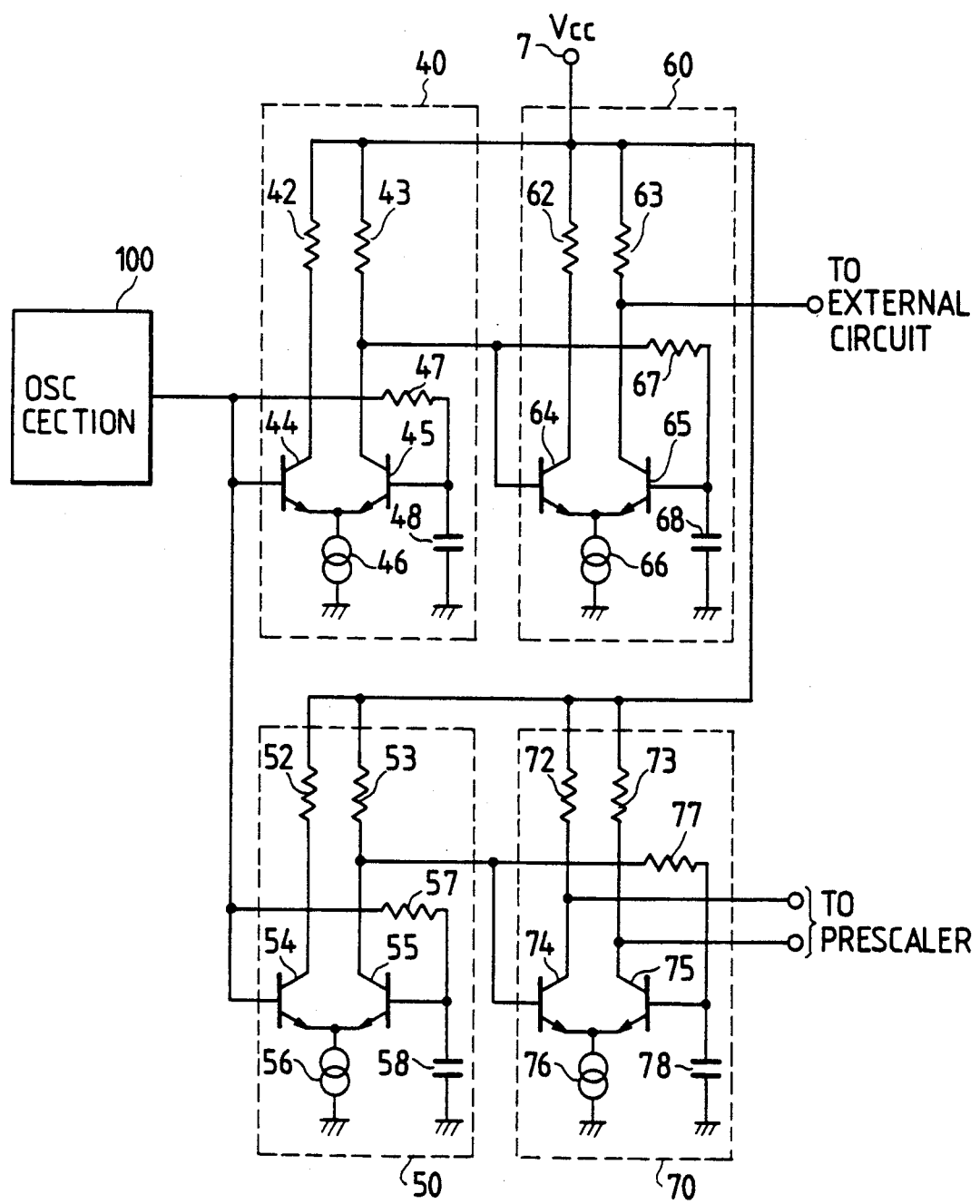
FIG. 6 is a diagram of an arrangement including an oscillating section and buffer amplifiers according to a sixth embodiment of this invention.

FIG. 6 shows a sixth embodiment of this invention. The embodiment of FIG. 6 includes an oscillating section 100 identical with any one of the oscillators of FIGS. 1-4. In addition, the embodiment of FIG. 6 includes a cascade combination of buffer amplifiers 40 and 60, and a cascade combination of buffer amplifiers 50 and 70. The buffer amplifiers 40, 50, 60, and 70 have similar internal designs. Specifically, each of the buffer amplifiers 40, 50, 60, and 70 includes a differential amplifier of a single-phase drive type. The cascade combination of the buffer amplifiers 40 and 60 is connected between the oscillating section 100 and an external circuit. The oscillation signal is transmitted to the external circuit via the buffer amplifiers 40 and 60. The cascade combination of the buffer amplifiers 50 and 70 is connected between the oscillating section 100 and a prescaler. The oscillation signal is transmitted to the prescaler via the buffer amplifiers 50 and 70.

The buffer amplifier 40 includes a pair of NPN transistors 44 and 45. The collectors of the transistors 44 and 45 are connected to the positive power supply terminal 7 via resistors 42 and 43 respectively. The base of the transistor 44 is directly coupled to an output terminal of the oscillating section 100 which corresponds to the junction 11 or 14 (see FIGS. 1-4). The base of the transistor 45 is connected to the output terminal of the oscillating section 100 via a resistor 47. The emitters of the transistors 44 and 45 are connected in common, and are grounded via a constant current circuit 46. In addition, the base of the transistor 45 is grounded via a bypass capacitor 48. The bypass capacitor 48 shunts an RF signal to the ground which returns from the collector to the base of the transistor 45, so that a good isolation between an input side and an output side of the buffer amplifier 40 is ensured with respect to the RF signal.

The buffer amplifier 60 includes a pair of NPN transistors 64 and 65. The collectors of the transistors 64 and 65 are connected to the positive power supply terminal 7 via resistors 62 and 63 respectively. The base of the transistor 64 is directly connected to the collector of the transistor 45 within the buffer amplifier 40. The base of the transistor 65 is connected to the collector of the transistor 45 within the buffer amplifier 40 via a resistor 67. The emitters of the transistors 64 and 65 are connected in common, and are grounded via a constant current circuit 66. In addition, the base of the transistor 65 is grounded via a bypass capacitor 68. The operation and effect of the bypass capacitor 68 are similar to those of the bypass capacitor 48 of the buffer amplifier 40. An RF signal is generated at the collector of the transistor 65 in accordance with the oscillation signal. The RF signal is outputted from the collector of the transistor 65 to the external circuit.

The buffer amplifier 50 includes a pair of NPN transistors 54 and 55. The collectors of the transistors 54 and 55 are connected to the positive power supply terminal 7 via resistors 52 and 53 respectively. The base of the transistor 54 is directly coupled to the output terminal of the oscillating section 100. The base of the transistor 55 is connected to the output terminal of the oscillating section 100 via a resistor 57. The emitters of the transistors 54 and 55 are connected in common, and are grounded via a constant current circuit 56. In addition, the base of the transistor 55 is grounded via a bypass capacitor 58. The operation and effect of the bypass capacitor 58 are similar to those of the bypass capacitor 48 of the buffer amplifier 40.

The buffer amplifier 70 includes a pair of NPN transistors 74 and 75. The collectors of the transistors 74 and 75 are connected to the positive power supply terminal 7 via resistors 72 and 73 respectively. The base of the transistor 74 is directly connected to the collector of the transistor 55 within the buffer amplifier 50. The base of the transistor 75 is connected to the collector of the transistor 55 within the buffer amplifier 50 via a resistor 77. The emitters of the transistors 74 and 75 are connected in common, and are grounded via a constant current circuit 76. In addition, the base of the transistor 75 is grounded via a bypass capacitor 78. The operation and effect of the bypass capacitor 78 are similar to those of the bypass capacitor 48 of the buffer amplifier 40. A pair of RF signals are generated at the collectors of the transistors 74 and 75 respectively in accordance with the oscillation signal. These RF signals have opposite phases. The RF signals are outputted from the collectors of the transistors 74 and 75 to the prescaler.

What is claimed is:

1. An arrangement for supplying an oscillation signal to an external circuit and a prescaler, comprising:
   an oscillator;
   a first buffer connected between the oscillator and the external circuit and including at least one differential amplifier of a single-phase drive type; and
   a second buffer connected between the oscillator and the prescaler and including at least one differential amplifier of a single-phase drive type;
   wherein the differential amplifier of each of the first and second buffers comprises first and second transistors, a resistor, and a bypass capacitor, wherein a base of the first transistor is directly connected to the oscillator and a base of the second transistor is connected to the oscillator via the resistor, and the base of the second transistor is grounded via the capacitor; and wherein a collector of each second transistor is connected to the external circuit and the prescaler, respectively.

2. The arrangement of claim 1 wherein each buffer includes at least a two-stage differential amplifier of a single-phase drive type.

3. An arrangement for supplying an oscillation signal to an external circuit and a prescaler, comprising:
   an oscillator;
   a first buffer connected between the oscillator and the external circuit and including at least one differential amplifier of a single-phase drive type; and
   a second buffer connected between the oscillator and the prescaler and including at least one differential amplifier of a single-phase drive type;
   wherein the differential amplifier of each of the first and second buffers comprises first and second transistors, a resistor, and a bypass capacitor, wherein a base of the first transistor is directly connected to the oscillator and a base of the second transistor is connected to the oscillator via the resistor, and the base of the second transistor is grounded via the capacitor, and wherein a collector of each second transistor is connected to the external circuit and the prescaler, respectively;
   wherein the oscillator comprises third and fourth transistors, a parallel resonant circuit having first and second ends, wherein the first end of the resonant circuit is connected to a base of the third transistor and a collector of the fourth transistor, and the second end of the resonant circuit is connected to a base of the fourth transistor and a collector of the third transistor; a power supply; and voltage dropping means connected between the first end of the resonant circuit and the power supply for providing a voltage drop to expose the third and fourth transistors to driving voltages lower than a voltage of the power supply.

* * * * *